(12) United States Patent
Kwok et al.

(10) Patent No.: US 9,214,568 B2
(45) Date of Patent: Dec. 15, 2015

(54) THIN FILM TRANSISTOR WITH TWO-DIMENSIONAL DOPING ARRAY

(71) Applicant: The Hong Kong University of Science and Technology, Hong Kong (CN)

(72) Inventors: Hoi Sing Kwok, Hong Kong (CN); Meng Zhang, Hong Kong (CN); Shuming Chen, Hong Kong (CN); Wei Zhou, Hong Kong (CN); Man Wong, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 33 days.

(21) Appl. No.: 14/104,762

(22) Filed: Dec. 12, 2013

(65) Prior Publication Data

US 2014/0159039 A1   Jun. 12, 2014

Related U.S. Application Data

(60) Provisional application No. 61/797,637, filed on Dec. 12, 2012.

(51) Int. Cl.
*H01L 21/00* (2006.01)
*H01L 29/786* (2006.01)
*H01L 29/66* (2006.01)

(52) U.S. Cl.
CPC ...... *H01L 29/78696* (2013.01); *H01L 29/6675* (2013.01); *H01L 29/78675* (2013.01)

(58) Field of Classification Search
CPC .............................. H01L 29/7869; H01L 21/16

USPC ............................................... 257/43; 438/85
See application file for complete search history.

(56) References Cited

U.S. PATENT DOCUMENTS

| 8,426,865 B2 | 4/2013 | Kwok et al. | |
| 2004/0004222 A1* | 1/2004 | Ahn | 257/72 |
| 2004/0046171 A1* | 3/2004 | Lee et al. | 257/66 |
| 2004/0248386 A1* | 12/2004 | Nishitani et al. | 438/478 |
| 2005/0161738 A1* | 7/2005 | Hiramatsu et al. | 257/347 |
| 2006/0030089 A1* | 2/2006 | Chung | 438/151 |
| 2010/0171546 A1* | 7/2010 | Kwok et al. | 327/537 |
| 2011/0084276 A1* | 4/2011 | Kang et al. | 257/57 |
| 2014/0159039 A1* | 6/2014 | Kwok et al. | 257/43 |

OTHER PUBLICATIONS

Barraud, J., "The Use of Watershed Segmentation and GIS software for textural analysis of thin sections", *Journal of Volcanolgoy and Geothermal Research* 154 (2006), pp. 17-33.
M. Zhang et al., "High-Performance Low-Temperature Polycrystalline-Silicon Thin Film Transistors with Submicron-Dot-Array Doped Active Channel," *SID 2013 Digest*, pp. 871-873.

(Continued)

*Primary Examiner* — Jami M Valentine
(74) *Attorney, Agent, or Firm* — Leydig, Voit & Mayer, Ltd.

(57) ABSTRACT

A thin film transistor includes: a source region; a drain region; and a polycrystalline thin film active channel region connected to the source region and the drain region, the active channel region comprising grains and being doped with a two-dimensional pattern comprising a plurality of doped regions, the plurality of doped regions each comprising at least portions of a plurality of the grains and at least one grain boundary.

20 Claims, 9 Drawing Sheets

(56) References Cited

OTHER PUBLICATIONS

M. Wang, Z. Meng, and M. Wong, "The effects of high temperature annealing on metal-induced laterally crystallized polycrystalline silicon," *IEEE Trans.* Electron Devices, 2000 vol. 47, No. 11, pp. 2061-2067.

H. C. Cheng, F. S. Wang, and C. Y. Huang "Effects of NH3 plasma passivation on N-channel polycrystalline silicon thin-film transistors," *IEEE Trans. Electron Devices*, 1997, vol. 44, No. 1, pp. 64-68.

M. Zhang, M. Wang, H. Wang, and J. Zhou, "Degradation of Metal-Induced Laterally Crystallied n-Type Polycrystalline Silicon Thin-Film Transistors under Synchronized Voltage Stress," *IEEE Trans.* Electron devices, 2009, vol. 56, pp. 2726-2732.

N. Yamauchi and R. Reif, "Polycrystalline Silicon Thin-Films Processed with Silicon Ion-Implantation and Subsequent Solid-Phase Crystallization—Theory, Experiments, and Thin-Film-Transistor Applications," 1994, *J. Appl. Phys.*, vol. 75, pp. 3235-3257.

M. Miyasaka and J. Steomenos, "Excimer laser annealing of amorphous and solid-phase-crystallized silicon films," 1999, *J. Appl. Phys.*, vol. 86, pp. 5556-5565.

Z. Meng, M. Wang and M. Wong, "High Performance Low Temperature Metal-Induced Unilaterally Crystallized Polycrystalline Silicon This Film Transistors for System-on-Panel Applications," *IEEE Trans.* Electron devices, 2000, vol. 47, pp. 404-409.

M. Zhang, M. Wang, X. Lu, M. Wong and H. S. Kwok, "Analysis of Degradation Mechanisms in Low-Temperature Polycrystalline Silicon Thin-Film Transistors under Dynamic Drain Stress", *IEEE Trans.* Electron devices, 2012, vol. 59, pp. 1730-1737.

Wei Zhou, Zhiguo Meng, Shuyun Zhao, Meng Zhang, Rongsheng Chen, Man Wong and Hoi-Sing Kwok, "Bridged-Grain Solid-Phase-Crystallized Polycrystalline-Silicon Thin-Film Transistors", *IEEE Electron Device Lett.*, vol. 33, pp. 1414-1416, 2012.

Hsiao-WenZan, Wei Tsai, Chia-Hsin Chen and Chuang-Chuang Tsai "Effective Mobility Enhancement by Using Nanometer Dot Doping in Amorphous IGZO Thin-Film Transistors", *Advanced Materials*, vol. 23, pp. 4237-4242, 2011.

Anh.D. Wanzenboeck, C. Ostermaier, A. Gruen, B. Eichinger, M. Karnerand E. Bertagnolli, "Don-array implantation for patterned doping of semiconductors", *Nuclear Instruments and Methods in Physics Research B* vol. 242, pp. 257-260, 2006.

* cited by examiner

THIN FILM TRANSISTOR WITH TWO-DIMENSIONAL DOPING ARRAY

CROSS-REFERENCE TO RELATED APPLICATIONS

This patent application claims the benefit of U.S. Provisional Patent Application No. 61/797,637, filed Dec. 12, 2012, which is incorporated by reference.

FIELD

Embodiments of the invention pertain to polycrystalline thin film transistors. Specifically, embodiments of the invention involve doping the active channel of a thin film transistor structure with small regions in a dot array pattern.

BACKGROUND

Thin film transistors (TFTs) are used in active matrix displays and other electronic devices. A TFT includes an active channel of semiconductor material, with a source and a drain electrode connected to the active channel. An insulated gate is then used to control the current flowing through the active channel by applying an electric field.

Most TFTs are made with amorphous silicon thin film as the material for the active channel. Polycrystalline material, including low temperature polycrystalline silicon (LTPS), is also used for high performance TFTs (i.e., TFTs having high mobility, steep subthreshold swing, and large on/off ratio). High performance TFTs are needed for active matrix organic light emitting diodes (AMOLEDs) as well as for high resolution liquid crystal displays (LCDs). High performance TFTs are also needed for system-on-glass applications.

There are three major LTPS technologies for producing LTPS: (1) solid phase crystallization (SPC), (2) excimer laser crystallization (ELA) or flash lamp annealing, and (3) metal induced crystallization (MIC) and its related variations. SPC is the simplest and the most direct approach to obtain polycrystalline silicon (poly-Si) film with low cost, but it takes a relatively long time and SPC TFTs have relatively poor performance. ELA can be used to produce relatively high performance TFTs, but is very expensive. MIC gives relatively moderate performance TFTs, but there are contamination issues associated with the MIC process. None of these methods can meet the requirements of high performance and low cost.

SUMMARY

In an embodiment, the present invention provides a thin film transistor. The thin film transistor includes: a source region; a drain region; and a polycrystalline thin film active channel region connected to the source region and the drain region, the active channel region comprising grains and being doped with a two-dimensional pattern comprising a plurality of doped regions, the plurality of doped regions each comprising at least portions of a plurality of the grains and at least one grain boundary.

In another embodiment, the thin film transistor includes: a source region; a drain region; and a metal oxide thin film active channel region connected to the source region and the drain region, the active channel region being doped with a two-dimensional pattern comprising a plurality of doped regions, the plurality of doped regions arranged in the two-dimensional pattern being configured to provide short channel effects for increasing on-current and multi junction effects for decreasing off current.

In other embodiments the present invention provides methods for fabricating thin film transistors doped with two-dimensional patterns of dopants in an active channel region.

BRIEF DESCRIPTION OF THE SEVERAL VIEWS OF THE DRAWINGS

The invention will be described in even greater detail below based on the exemplary figures. The invention is not limited to the exemplary embodiments. All features described and/or illustrated herein can be used alone or combined in different combinations in embodiments of the invention. The features and advantages of various embodiments of the invention will become apparent by reading the following detailed description with reference to the attached drawings which illustrate the following.

DETAILED DESCRIPTION

Figure 1:
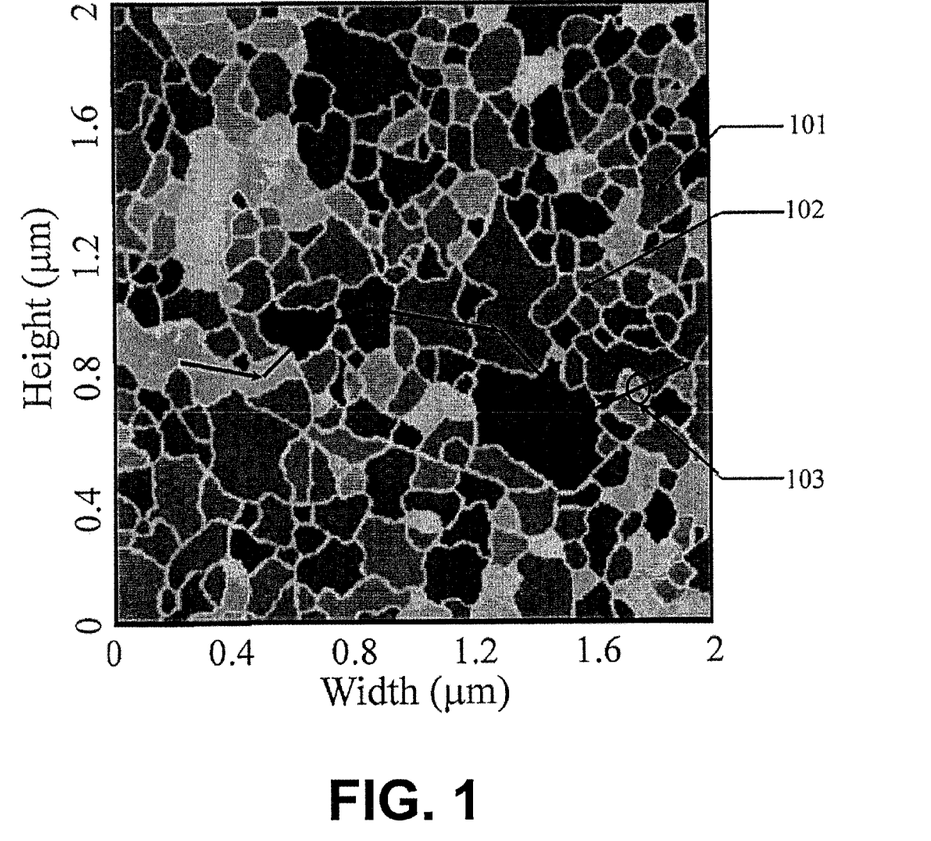
FIG. 1 is a plot illustrating an exemplary configuration of grains in a section of polycrystalline thin film.

FIG. 1 is a plot illustrating a configuration of grains 101 in a section of polycrystalline thin film, as imaged via atomic force microscopy (AFM) based on grain detection for SPC poly-Si. Grain detection using AFM can be performed, for example, based on the principles described in Barraud, J., "The use of watershed segmentation and GIS software for textural analysis of thin sections", Journal of Volcanology and Geothermal Research 154 (2006), pp. 17-33 (referred to hereinafter as "Barraud").

It is common for a polycrystalline thin film to be formed by grains 101 that are randomly distributed in size, in orientation and in shape. The grain boundaries (GBs) 102 are an important consideration in forming high quality TFTs. When a TFT employs polycrystalline thin film as the active channel for the TFT, the number of grains and GBs in the active channel affects device performance.

Polycrystalline thin films fabricated according to conventional methods, such as according to the three LTPS technologies mentioned in the Background section above, have grains and GBs in unpredictable distributions. The conductivity within a grain of a polycrystalline silicon thin film is nearly the same as the conductivity of single crystalline silicon, but the conductivity between the two grains is low due to the barriers corresponding to GBs. These GBs' barriers lower carrier mobility ($\mu$) and increase threshold voltage ($V_{th}$). When carriers traverse a polycrystalline thin film, they travel along the most direct path having the least GBs, e.g., as illustrated in FIG. 1 by the exemplary path 103.

Embodiments of the invention provide significant improvements to the electrical properties of TFTs relative to conventional TFTs. Referred to herein as dot array (DA) doping, embodiments of the invention provide for doping the active channel of a TFT in a two-dimensional dot pattern, resulting in increased mobility $\mu$ for the TFT, as well as great improvement in terms of maximum field-effect mobility ($\mu_{FE}$), subthreshold swing (SS), and on-off ratio. Generally, relative to conventional methods for attempting to reduce the effects of GBs, DA doping as provided by embodiments of the invention achieves many advantages, including: improved $\mu_{FE}$, improved SS, reduced $V_{th}$ and off current, increased on-off ratio, low-temperature compatibility, improved uniformity, and improved reliability and consistency (i.e., without process variation).

A previous innovation for improving the electrical characteristics of TFTs developed by the inventors' research group was to use a bridged-grain TFT structure—e.g., as described in U.S. Pat. No. 8,426,865 to Kwok et al, and in Zhou et al., "Bridged-Grain Solid-Phase-Crystallized Polycrystalline-Silicon Thin-Film Transistors", IEEE Electron Device Lett., 2012, vol. 33, pp. 1414-1416. Unlike bridged-grain TFT structures, which have one-dimensional BG lines with TFTs in a panel being oriented in a specific way based thereon, DA TFT structures according to embodiments of the invention provide for two-dimensional layout flexibility. Further, the on-current of DA TFTs is larger than that of BG TFTs due to DA TFTs producing relatively more short channel effects. However, the off-current for DA TFTs is also larger than for BG TFTs, which may be due to weakened multi junction effects.

Generally, for a polycrystalline silicon thin film with randomly distributed grains (such as grains 101 as depicted in FIG. 1), embodiments of the present invention provide for linking the grains inside the active channel of a TFT by employing a two-dimensional DA. The dots of the DA are heavily doped, which causes the GBs to be essentially shielded (i.e., the potential barriers at GBs are lowered due to the doped regions acting as a conductor) and results in high electrical performance for TFTs (e.g., high mobility and large on-current).

Figure 2:
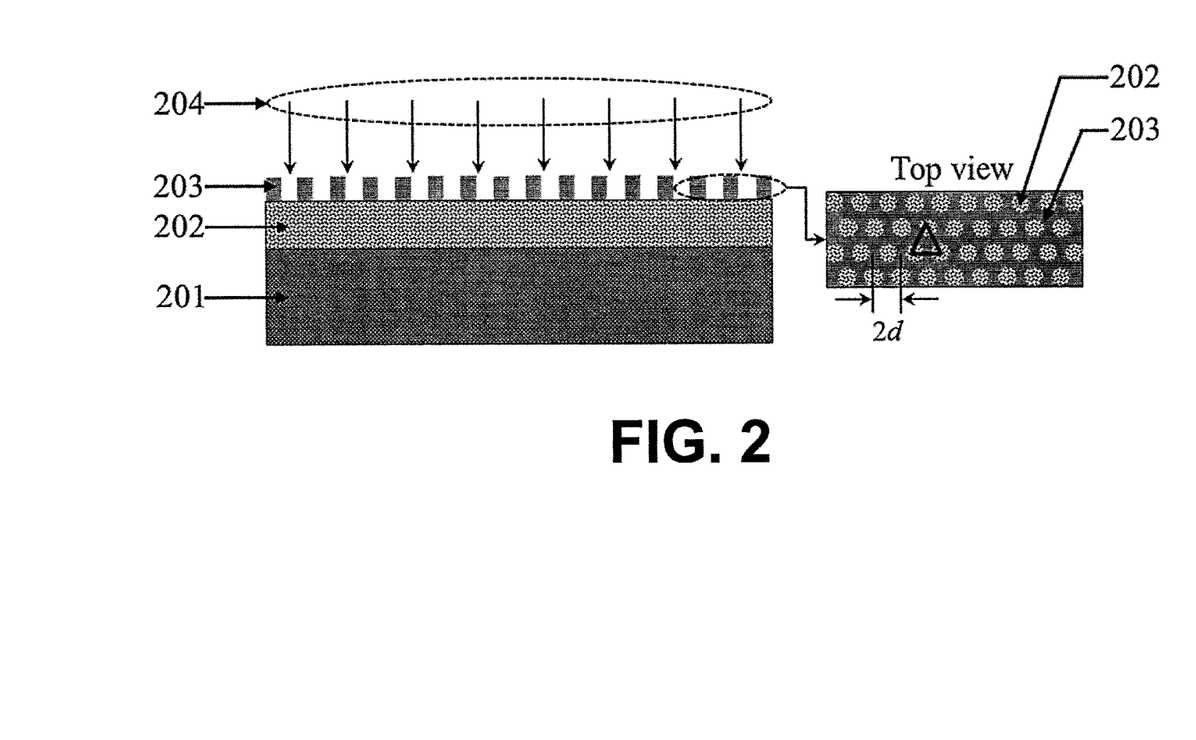
FIG. 2 is a diagram illustrating a cross-sectional schematic of a dot array (DA) TFT during fabrication and a corresponding top view in an exemplary embodiment.

In a particular exemplary embodiment, a method for fabricating DA TFTs is depicted by FIG. 2, and will be explained in further detail as follows with respect to FIGS. 2-6. FIG. 2 is a diagram illustrating a cross-sectional schematic of a DA TFT during fabrication and a corresponding top view. The method for fabrication includes growing a layer of poly-Si thin film 202 on a substrate 201. The poly-Si thin film 202 can be formed, for example, by using SPC, ELA or MIC technology. The substrate 201 can be glass or thick thermal oxide buffered Si wafers, or other conventional substrate materials. The DA pattern may be achieved, for example, through lithography using a mask, laser interference lithography or by nano-imprint technology.

Figure 3:
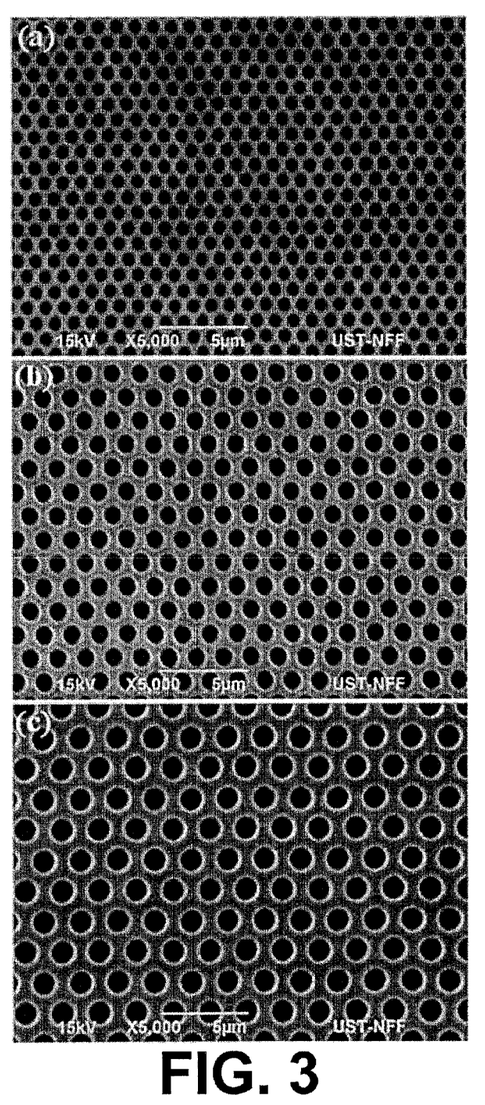
FIG. 3 includes scanning electron microscope images of examples of DA patterns for a photoresist mask on polycrystalline thin film used during doping with (a) corresponding to $d=0.5$ µm; (b) corresponding to $d=0.75$ µm; and (c) corresponding to $d=1$ µm, where d is the diameter of a dot in the corresponding dot array (DA) pattern.
Figure 4:
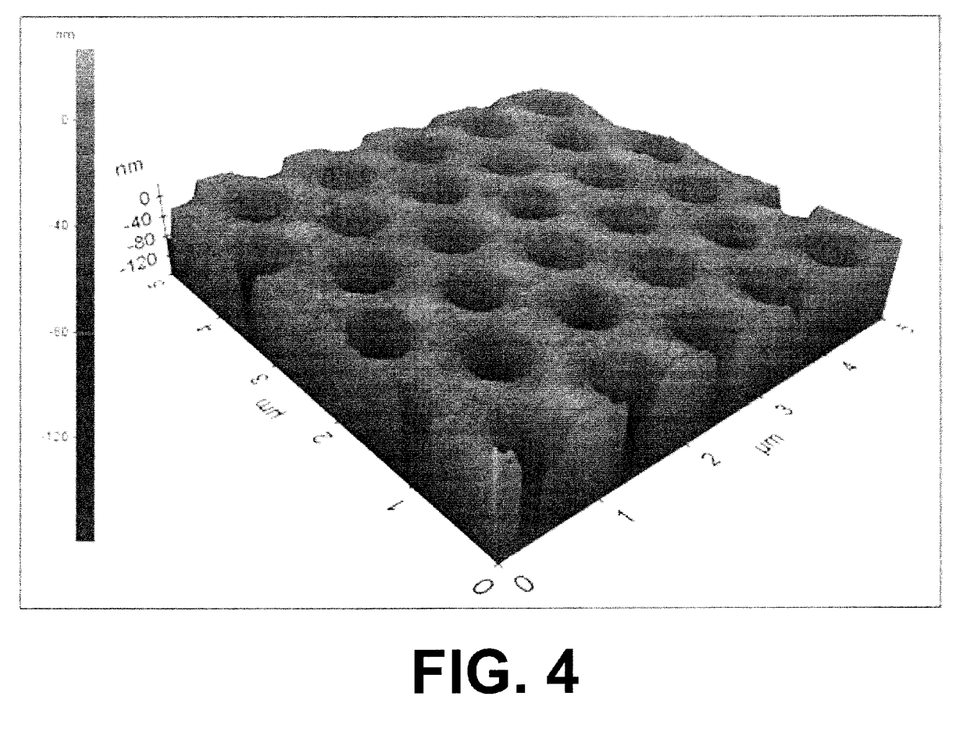
FIG. 4 is a plot of an atomic force microscopy image of an example of a DA pattern for a photoresist mask on polycrystalline thin film where $d=0.5$ µm.

As will be discussed below in further detail, in one example, three different exemplary SPC poly-Si DA TFT devices were fabricated with three different diameters for the dots in the corresponding DA pattern (0.5 $\mu$m, 0.75 $\mu$m, and 1 $\mu$m, respectively). The characteristics of these devices were then compared to a control TFT device fabricated without any DA pattern, as well as a comparable exemplary BG TFT device (as will be discussed further below). FIG. 3 includes scanning electron microscope images of examples of DA patterns for a photoresist mask on polycrystalline thin film used during doping (a) corresponding to d=0.5 $\mu$m; (b) corresponding to d=0.75 $\mu$m; and (c) corresponding to d=1 $\mu$m, where d is the diameter of a dot in the corresponding DA pattern. FIG. 4 is a plot of an atomic force microscopy image of a DA pattern for a photoresist mask on polycrystalline thin film where d=0.5 $\mu$m.

After formation of the DA pattern in a photoresist mask 203, which is applied to the polycrystalline film, the dopant 204 is implanted into the active channel in the DA pattern (corresponding to areas not covered by photoresist 203). The dopant can be n- or p-type, and the dosage should be adjusted to an appropriate value for forming a conductive DA pattern in the active channel. Normally, the range of dosage is between $10^{12}$ to $10^{16}$ $cm^{-2}$, with an appropriate value being chosen based on the material being doped and the DA pattern being used.

Figure 5:
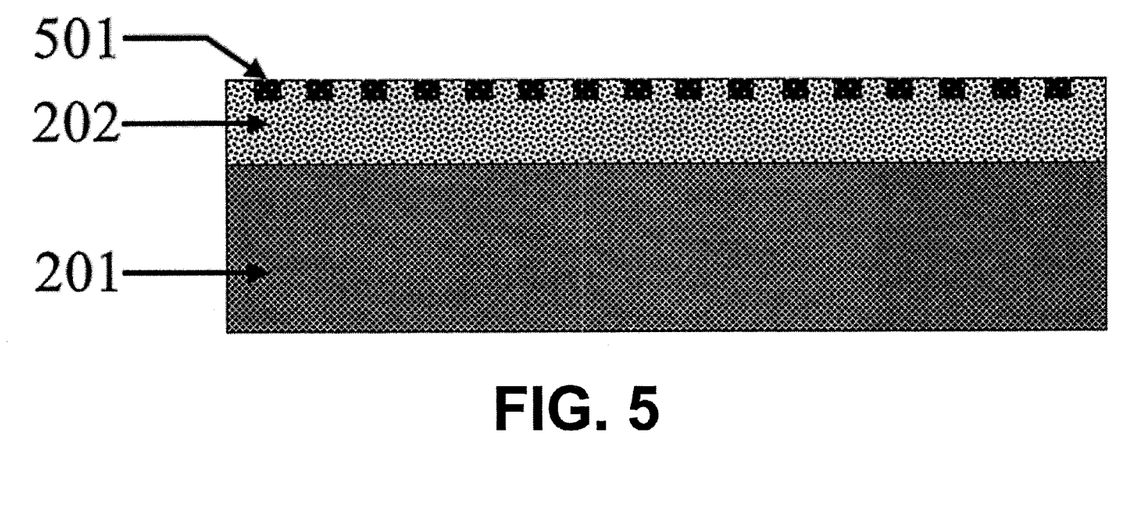
FIG. 5 is a diagram illustrating a cross-sectional schematic of a DA doped polycrystalline thin film on a substrate, including the active channel region, in an exemplary embodiment.

After implantation, the photoresist 203 is removed and the DA doping pattern exists in the active channel as shown in FIG. 5, which is a diagram illustrating a cross-sectional schematic of a DA doped polycrystalline thin film on a substrate, including the active channel region. The dopants can be activated at a later processing stage after the source/drain regions of the TFT structure are formed.

Figure 6:
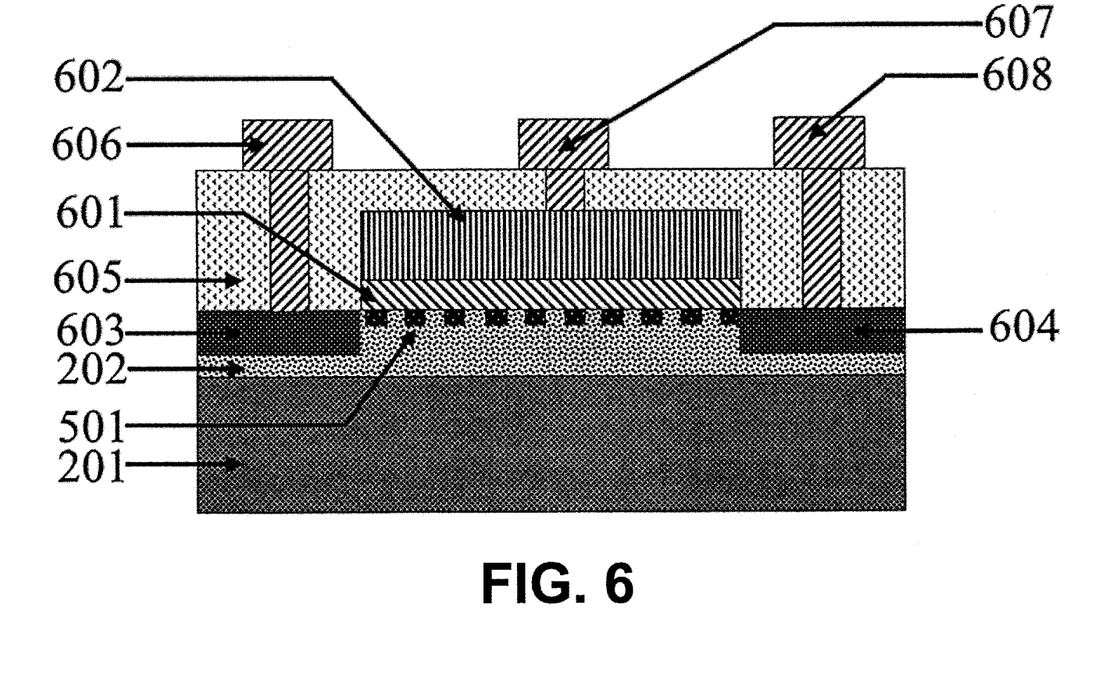
FIG. 6 is a diagram illustrating a cross-sectional schematic of a DA TFT structure in an exemplary embodiment.

FIG. 6 is a diagram illustrating an example of a complete cross-sectional schematic of a DA TFT structure. As can be seen in FIG. 6, following the removal of the photoresist 203, active islands corresponding to the source, drain, and channel regions are patterned, followed by depositing of a gate dielectric 601. Then, a layer of film (e.g., metal or poly-Si) is deposited and patterned as gate electrode 602. Self-aligned dopant implantation is performed to form source region 603 and drain region 604. The dopants are then activated. After activation, a layer of oxide or nitride 605 is then deposited, and contact holes are defined for the source, drain, and gate electrodes. A layer of Al-1% Si is then sputtered and patterned to form source electrode 606, gate electrode 607 and drain electrode 608.

Devices undergoing fabrication according to this exemplary process (e.g., the three exemplary devices having dot diameters of 0.5 $\mu$m, 0.75 $\mu$m, and 1 $\mu$m mentioned above) are then sintered in forming gas for 30 minutes at 420° C. No further passivation was applied to these devices in this example.

Figure 7:
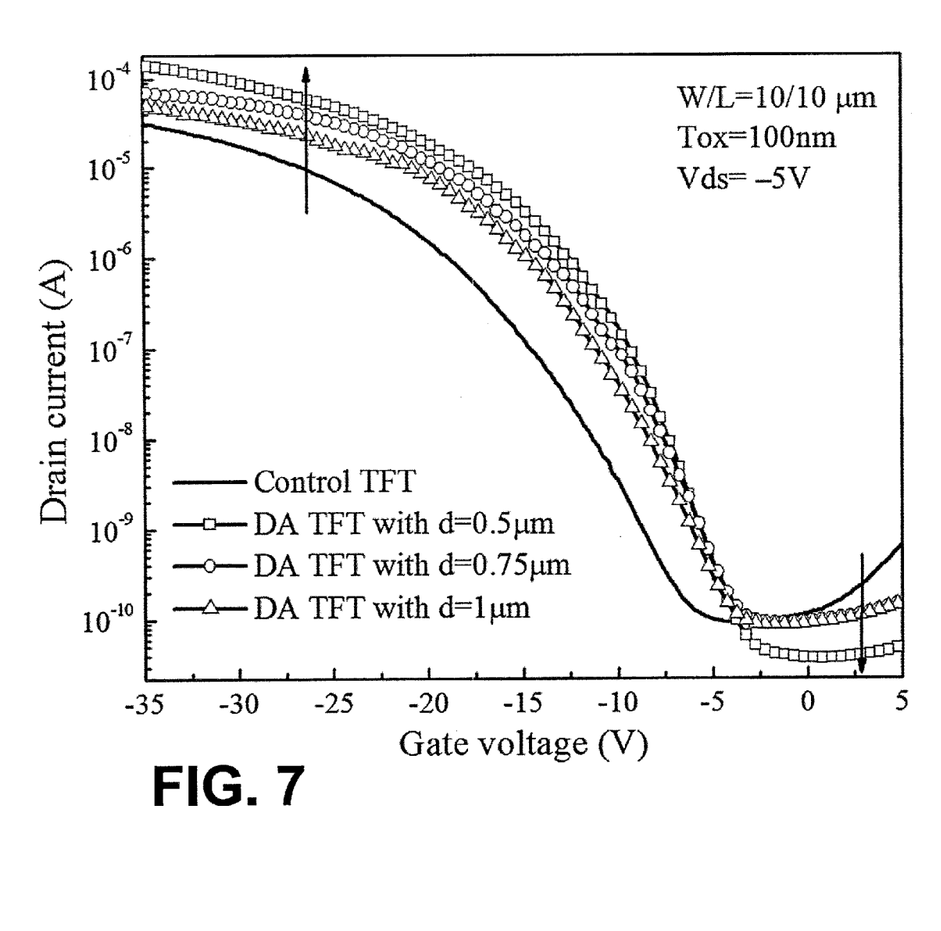
FIG. 7 is a graph showing the transfer curves of exemplary SPC poly-Si TFT devices with DA doping of different dot diameters and a control TFT device without DA doping, measured at $V_{ds}=-5V$.

FIG. 7 is a graph illustrating the transfer curves of the three exemplary SPC poly-Si DA TFTs with different sizes of dots for the DA pattern, as well as the transfer curve of a control TFT without DA doping, measured at Vds=−5V. It can be seen from FIG. 7 that, relative to the control TFT, DA TFTs clearly show better performance in terms of higher on current, lower gate-induced drain leakage (GIDL) current, and steeper SS.

These exemplary devices also demonstrated that the $\mu_{FE}$ can increase from 14.6 $cm^2$/Vs (for the control TFT) to 58.4 $cm^2$/Vs (for a DA TFT employing d=0.5 $\mu$m DA doping). Further, using smaller d for the dots of the DA pattern was demonstrated as providing relatively better device performance due to relatively more severe short channel effects resulting in higher on-current.

Figure 8:
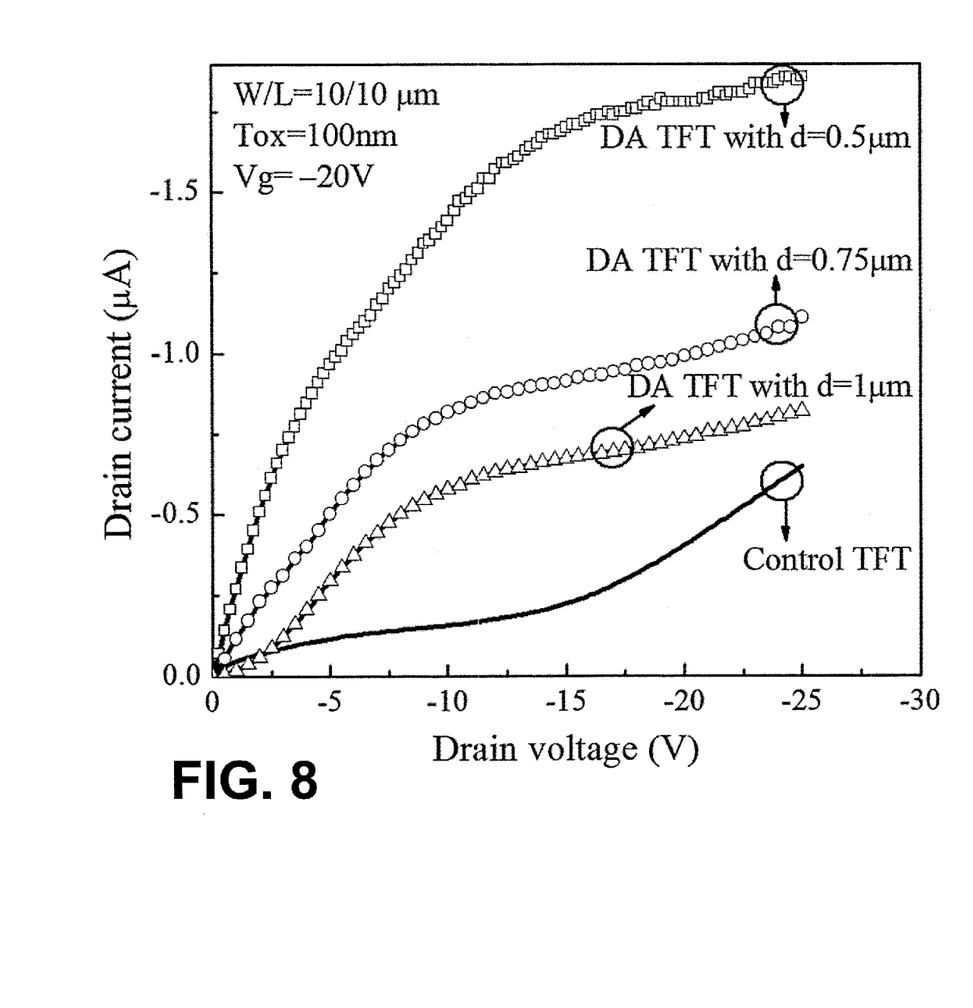
FIG. 8 is a graph showing the output curves of exemplary SPC poly-Si TFT devices with DA doping of different dot diameters and a control TFT device without DA doping, measured at $V_g=-20V$.

FIG. 8 is a graph illustrating the output curves of exemplary SPC poly-Si TFT devices with different size DA doping and a control TFT device, measured at Vg=−20V. Consistent with transfer curves shown in FIG. 7, TFTs with DA doping have larger on current relative to the control TFT device. In addition to enhancing on current, FIG. 8 demonstrates that kink current can be greatly suppressed by employing DA structures, providing improved hot carrier reliability (which may be attributable to electric field reduction caused by the DA structures).

Measured data and the extracted device parameters are summarized in TABLE I below. The three DA SPC TFTs in TABLE I were produced according to the exemplary process discussed above in accordance with an embodiment of the invention. The control TFT in TABLE I was produced using a similar procedure without any of the DA doping steps. The BG SPC TFT in TABLE I was produced using the same method as described in U.S. Pat. No. 8,426,865 to Kwok et al., with a BG line width of 0.5 µm and a 50% duty ratio.

TABLE I

|  | Mobility (cm$^2$/Vs) | SS (V/dec) | $I_{on}/I_{off}$(×10$^5$) |
| --- | --- | --- | --- |
| Control TFT | 14.6 | 1.49 | 5.09 |
| DA SPC TFT with d = 0.5 µm | 58.4 | 1.02 | 51.94 |
| DA SPC TFT with d = 0.75 µm | 34.7 | 1.12 | 9.92 |
| DA SPC TFT with d = 1.0 µM | 24.5 | 1.15 | 6.98 |
| BG SPC TFT with line width = 0.5 µm and duty ratio = 50% | 47.2 | 0.97 | 344.79 |

It can be seen from Table I that BG SPC TFTs with line width of 0.5 µm achieves better SS and Ion/Ioff characteristics relative to a DA SPC TFT with d=0.5 µm, but the DA SPC TFT with d=0.5 µm achieves relatively better mobility characteristics and is advantageous with respect to high speed applications.

Figure 9:
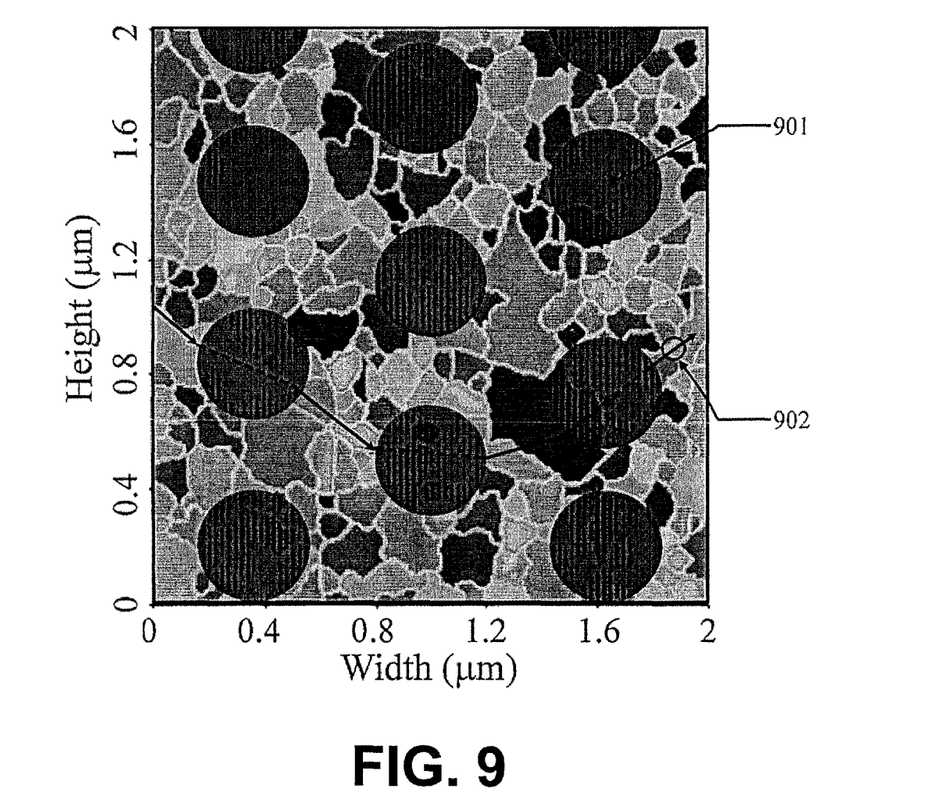
FIG. 9 is a plot illustrating an exemplary current flow through grains of a poly-Si thin film with DA doping.

To understand the conduction mechanism of DA TFTs, an SPC poly-Si film was first treated by tetramethylammonium hydroxide etching, and then atomic force microscopy (AFM) was used to determine the SPC grain size through examining surface topography. The image of grains corresponding to the plots depicted in FIG. 1 and FIG. 9 was obtained as described above using the principles of Barraud. The mean value of grain size for a poly-Si film is about 150 nm, as shown in FIG. 1 and FIG. 9. These small size grains result in high GB density.

FIG. 9 is a plot illustrating an exemplary current flow through grains of a poly-Si thin film with DA doping based on grain detection results (FIG. 9 uses the same image of grains as FIG. 1 but further includes an exemplary configuration of doped dot regions in a DA pattern along with different annotations of how carriers flow). As discussed above with respect to FIG. 1, carriers flow according to the most direct path 103 having the least GBs. And, in general, when carriers transfer from drain to source, they surmount many barriers at GBs, which limits the on current. However, as can be seen in FIG. 9, heavily-doped dots of the DA pattern (corresponding to the dark regions 901) are provided in the polycrystalline thin film. Once a carrier enters into a doped region, it can pick any path through the doped region freely since the heavily doped region effectively eliminates the existence of GBs within the region. The exemplary path 902 shown in FIG. 9 illustrates this principle: the dots of the DA pattern link small grains and enhance on current.

Compared to BG lines, the transfer carrier has more opportunities to choose the transfer path with less GBs, resulting in higher on current of DA TFTs than that of BG TFTs. For the off state, the Gate-Induced Drain Leakage (GIDL) current increases exponentially as a function of this reverse electric field. The BG line structure may more effectively terminate the electric field than DA structure since the doped region density of DA is smaller than that of BG lines, resulting in lower GIDL current of BG TFTs.

Further discussion regarding fabrication of exemplary devices and regarding experimental results may be found in M. Zhang et al., "High-Performance Low-Temperature Polycrystalline-Silicon Thin Film Transistors with Submicron-Dot-Array Doped Active Channel," SID 2013 DIGEST, pp. 871-873, which is incorporated herein by reference in its entirety.

While the examples discussed above have utilized SPC TFT structures to illustrate the advantages of using dot arrays for TFT structures in LTPS TFT application, it will be appreciated that other types of TFT structures, such as TFT structures based on other LIPS techniques (e.g., ELA, MIC) can also benefit in a similar way from using the dot array TFT structures described herein according to other embodiments of the invention.

In alternative embodiments, rather than using a polycrystalline thin film for the active region, the concepts of dot array doping can also be used with respect to metal oxide thin TFTs having metal oxide active regions. The dot array doping pattern provides short channel effects that also enhance on current and multi junction effects that also decrease off-current for DA metal oxide TFTs relative to non-DA metal oxide TFTs.

Further, it will be appreciated that while the exemplary embodiments above have specifically discussed using a "dot" array pattern, it will be appreciated that one skilled in the art could use different geometric shapes (e.g., ellipses, rectangles, etc.) arranged in different two-dimensional array patterns as well.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method for producing active regions for a thin film transistor, the method comprising:
   forming a polycrystalline thin film layer on a substrate;
   doping the polycrystalline thin film layer with dopants in a two-dimensional pattern such that the doped polycrystalline thin film layer comprises a plurality of doped regions in the two-dimensional pattern, the plurality of doped regions each comprising at least portions of a plurality of grains of the polycrystalline thin film layer and at least one grain boundary, wherein the two-dimensional pattern includes doped regions offset from one another in a vertical direction and doped regions offset from one another in a horizontal direction; and
   forming a source region and a drain region in the polycrystalline thin film layer.

2. The method of claim 1, further comprising:
   applying a mask corresponding to the two-dimensional pattern to the polycrystalline thin film layer prior to the doping; and
   removing the mask after the doping.

3. The method of claim 1, wherein the polycrystalline thin film layer is a polycrystalline silicon thin film layer.

4. The method of claim 2, wherein the mask is a photoresist mask.

5. The method of claim 1, wherein forming the polycrystalline thin film utilizes solid phase crystallization (SPC), excimer laser annealing (ELA), or metal-induced crystallization (MIC).

6. The method of claim 1, wherein the plurality of doped regions in the two-dimensional pattern form a dot array comprising dot-shaped doped regions.

7. The method of claim 6, wherein the dot-shaped doped regions have diameters within the range of approximately 0.5 μm to approximately 1.0 μm.

8. The method of claim 1, wherein doping the polycrystalline thin film layer with dopants in a two-dimensional pattern utilizes lithography using a mask, laser interference lithography, or nano-imprinting.

9. The method of claim 1, wherein the polycrystalline thin film layer with dopants in a two-dimensional pattern utilizes a dosage of approximately $10^{12}$ to $10^{16}$ $Cm^{-2}$.

10. The method of claim 1, further comprising:
    after the source region and the drain region are formed, activating the dopants in the polycrystalline thin film layer.

11. A thin film transistor, comprising:
    a source region;
    a drain region; and
    a polycrystalline thin film active channel region connected to the source region and the drain region, the active channel region comprising grains and being doped with a two-dimensional pattern comprising a plurality of doped regions, the plurality of doped regions each comprising at least portions of a plurality of the grains and at least one grain boundary, wherein the two-dimensional pattern includes doped regions offset from one another in a vertical direction and doped regions offset from one another in a horizontal direction.

12. The thin film transistor of claim 11, wherein the source region and the drain region are doped with dopants of the same polarity as the doping corresponding to the two-dimensional pattern in the active channel region.

13. The thin film transistor of claim 12, wherein the source region, the drain region, and the active channel regions are doped with p-type dopants.

14. The thin film transistor of claim 12, wherein the source region, the drain region, and the active channel regions are doped with n-type dopants.

15. The thin film transistor of claim 11, wherein the two-dimensional pattern is a dot array and wherein the plurality of doped regions are each shaped as an approximately circular dot.

16. The thin film transistor of claim 15, wherein the diameter of each dot is within the range of approximately 0.5 μm to approximately 1.0 μm.

17. The thin film transistor of claim 15, wherein the dot array comprises a plurality of rows of dots and wherein adjacent rows of dots are aligned to one another.

18. The thin film transistor of claim 15, wherein the dot array comprises a plurality of rows of dots and wherein adjacent rows of dots are not aligned to one another.

19. The thin film transistor of claim 11, wherein the polycrystalline thin film active channel region is a polycrystalline silicon thin film active channel region.

20. The thin film transistor of claim 19, wherein the polycrystalline silicon thin film of the polycrystalline silicon thin film active channel region was formed by solid phase crystallization (SPC), excimer laser annealing (ELA), or metal-induced crystallization (MIC).

* * * * *